(12) United States Patent
Hsu et al.

(10) Patent No.: US 11,043,388 B2
(45) Date of Patent: Jun. 22, 2021

(54) INTEGRATED CIRCUIT FABRICATION SYSTEM WITH ADJUSTABLE GAS INJECTOR AND METHOD UTILIZING THE SAME

(71) Applicant: Taiwan Semiconductor Manufacturing Co., Ltd., Hsin-Chu (TW)

(72) Inventors: Yung-Shun Hsu, Changhua County (TW); Ching-Yu Chang, Tainan (TW); Chiao-Kai Chang, Taichung (TW); Wai Hong Cheah, Taichung (TW); Chien-Fang Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/727,688

(22) Filed: Dec. 26, 2019

(65) Prior Publication Data
US 2020/0135510 A1 Apr. 30, 2020

Related U.S. Application Data

(62) Division of application No. 15/864,807, filed on Jan. 8, 2018.

(Continued)

(51) Int. Cl.
| | |
|---|---|
| *H01L 21/306* | (2006.01) |
| *H01L 21/3065* | (2006.01) |
| *H01L 21/67* | (2006.01) |
| *H01J 37/32* | (2006.01) |
| *H01L 21/3213* | (2006.01) |

(52) U.S. Cl.
CPC ......... *H01L 21/3065* (2013.01); *H01J 37/32* (2013.01); *H01J 37/32449* (2013.01); *H01J 37/32733* (2013.01); *H01L 21/32136* (2013.01); *H01L 21/67069* (2013.01); *H01L 21/67126* (2013.01); *H01L 21/67167* (2013.01); *H01L 21/67201* (2013.01); *H01J 2237/20214* (2013.01); *H01J 2237/334* (2013.01)

(58) Field of Classification Search
None
See application file for complete search history.

(56) References Cited

U.S. PATENT DOCUMENTS

| | | |
|---|---|---|
| 2,890,351 A | 6/1959 | Tongret |
| 3,519,491 A | 7/1970 | Grohall et al. |

(Continued)

FOREIGN PATENT DOCUMENTS

| | | |
|---|---|---|
| CN | 1639831 A | 7/2005 |
| CN | 101529997 A | 9/2009 |

(Continued)

*Primary Examiner* — Duy Vu N Deo
(74) *Attorney, Agent, or Firm* — Haynes and Boone, LLP

(57) ABSTRACT

The present disclosure provides a semiconductor fabrication apparatus. The semiconductor apparatus includes a processing chamber; a substrate stage provided in the processing chamber and being configured to secure and rotate a semiconductor wafer; a gas injector configured to inject a chemical to the processing chamber; a window attached to the gas injector; and an adjustable fastening device coupled with the gas injector and the window.

20 Claims, 6 Drawing Sheets

Related U.S. Application Data

(60) Provisional application No. 62/565,325, filed on Sep. 29, 2017.

(56) References Cited

U.S. PATENT DOCUMENTS

| | | |
|---|---|---|
| 3,707,452 A | 12/1972 | Lester et al. |
| 3,877,131 A | 4/1975 | Grenville |
| 3,886,474 A | 5/1975 | Hensolt et al. |
| 3,987,699 A | 10/1976 | Popenoe |
| 4,478,701 A | 10/1984 | Welch et al. |
| 4,638,486 A | 1/1987 | Dost et al. |
| 4,686,685 A | 8/1987 | Hoag |
| 4,769,824 A | 9/1988 | Seki |
| 4,953,036 A | 8/1990 | Yoshimura |
| 5,038,711 A | 8/1991 | Dan et al. |
| 5,354,413 A | 10/1994 | Smesny et al. |
| 5,660,472 A | 8/1997 | Peuse et al. |
| 5,796,066 A | 8/1998 | Guyot |
| 5,985,092 A | 11/1999 | Chiu et al. |
| 6,079,874 A | 6/2000 | Hegedus |
| 6,080,241 A | 6/2000 | Li et al. |
| 6,090,210 A | 7/2000 | Balance et al. |
| 6,157,106 A | 12/2000 | Tietz et al. |
| 6,226,453 B1 | 5/2001 | Yam et al. |
| 6,246,175 B1 | 6/2001 | Kou et al. |
| 6,263,542 B1 | 7/2001 | Larson et al. |
| 6,267,545 B1 | 7/2001 | Mooring et al. |
| 6,366,346 B1 | 4/2002 | Nowak et al. |
| 6,493,375 B1 | 12/2002 | Kodeda et al. |
| 6,804,284 B1 | 10/2004 | Kodeda et al. |
| 6,936,135 B2 | 8/2005 | Antolik |
| 7,314,526 B1 | 1/2008 | Preti et al. |
| 7,318,879 B2 | 1/2008 | Kwon et al. |
| 7,524,532 B2 | 4/2009 | Jurgensen et al. |
| 8,083,891 B2 | 12/2011 | Sato |
| 8,547,085 B2 | 10/2013 | Booth et al. |
| 2001/0006530 A1 | 7/2001 | Adams et al. |
| 2001/0010257 A1 | 8/2001 | Ni et al. |
| 2001/0015175 A1 | 8/2001 | Masuda et al. |
| 2001/0041218 A1 | 11/2001 | Cook et al. |
| 2002/0014203 A1 | 2/2002 | Kim et al. |
| 2002/0100555 A1 | 8/2002 | Hao et al. |
| 2003/0070620 A1 | 4/2003 | Cooperberg et al. |
| 2004/0004989 A1 | 1/2004 | Shigeoka |
| 2004/0020439 A1 | 2/2004 | Chen et al. |
| 2004/0060516 A1 | 4/2004 | Nishimoto et al. |
| 2004/0129226 A1 | 7/2004 | Strang et al. |
| 2004/0134426 A1 | 7/2004 | Tomoyasu |
| 2004/0142558 A1 | 7/2004 | Granneman |
| 2004/0173155 A1 | 9/2004 | Nishimoto et al. |
| 2004/0237888 A1 | 12/2004 | Codella et al. |
| 2004/0262260 A1 | 12/2004 | Yang et al. |
| 2005/0109728 A1 | 5/2005 | Oh |
| 2005/0191044 A1 | 9/2005 | Aderhold et al. |
| 2006/0060138 A1 | 3/2006 | Keller et al. |
| 2006/0120011 A1 | 6/2006 | Handa et al. |
| 2006/0130763 A1 | 6/2006 | Emerson et al. |
| 2006/0144520 A1 | 7/2006 | Fink |
| 2006/0193037 A1 | 8/2006 | Strait |
| 2007/0039548 A1 | 2/2007 | Johnson |
| 2007/0166599 A1 | 7/2007 | Burtner et al. |
| 2007/0169704 A1 | 7/2007 | Hao et al. |
| 2007/0187363 A1 | 8/2007 | Oka et al. |
| 2007/0283704 A1* | 12/2007 | Tanaka ............ F04B 37/08 62/55.5 |
| 2008/0006204 A1 | 1/2008 | Rusinko et al. |
| 2008/0083883 A1 | 4/2008 | Bogart et al. |
| 2008/0169282 A1 | 7/2008 | Sorabji et al. |
| 2008/0233016 A1 | 9/2008 | Harvey |
| 2009/0016048 A1* | 1/2009 | McBrien ............ F21L 19/00 362/180 |
| 2009/0042321 A1 | 2/2009 | Sasaki et al. |
| 2009/0047801 A1 | 2/2009 | Low et al. |
| 2009/0159424 A1 | 6/2009 | Liu et al. |
| 2010/0007337 A1 | 1/2010 | Booth et al. |
| 2010/0200546 A1 | 8/2010 | Zaykova-Feldman et al. |
| 2010/0202042 A1 | 8/2010 | Marchman et al. |
| 2010/0304571 A1 | 12/2010 | Larson et al. |
| 2011/0054661 A1 | 3/2011 | Rasnick et al. |
| 2011/0114261 A1 | 5/2011 | Matsumoto et al. |
| 2011/0126394 A1 | 6/2011 | Heimmer |
| 2011/0141473 A1 | 6/2011 | Black et al. |
| 2011/0198417 A1 | 8/2011 | Detmar et al. |
| 2011/0290419 A1 | 12/2011 | Horiguchi et al. |
| 2011/0291568 A1 | 12/2011 | Iizuka |
| 2012/0000301 A1 | 1/2012 | Little et al. |
| 2012/0111269 A1 | 5/2012 | Du et al. |
| 2012/0238102 A1 | 9/2012 | Zhang et al. |
| 2012/0238103 A1 | 9/2012 | Zhang et al. |
| 2012/0305190 A1 | 12/2012 | Kang et al. |
| 2013/0098554 A1 | 4/2013 | Chhatre et al. |
| 2013/0127124 A1 | 5/2013 | Nam et al. |
| 2013/0133834 A1 | 5/2013 | Dhindsa |
| 2013/0188040 A1 | 7/2013 | Kamen et al. |
| 2013/0284700 A1 | 10/2013 | Nangoy et al. |
| 2013/0310990 A1 | 11/2013 | Peret et al. |
| 2013/0323860 A1 | 12/2013 | Antolik et al. |
| 2013/0340677 A1 | 12/2013 | Tas et al. |
| 2014/0024142 A1 | 1/2014 | Shriner et al. |
| 2014/0218817 A1 | 8/2014 | Gunell et al. |
| 2014/0377890 A1 | 12/2014 | Voronov et al. |
| 2015/0026941 A1 | 1/2015 | Heimmer |
| 2015/0107669 A1 | 4/2015 | Gotoh et al. |
| 2015/0225854 A1 | 8/2015 | Madsen |
| 2015/0233016 A1 | 8/2015 | Brillhart et al. |
| 2015/0371882 A1 | 12/2015 | Tsai et al. |
| 2015/0380281 A1 | 12/2015 | Sriraman et al. |
| 2016/0111265 A1 | 4/2016 | Siegert et al. |
| 2016/0141148 A1 | 5/2016 | Sun et al. |
| 2016/0163517 A1 | 6/2016 | Tanaka et al. |
| 2016/0181996 A1 | 6/2016 | Baecklund |
| 2016/0222508 A1 | 8/2016 | Schoepp et al. |
| 2016/0293431 A1 | 10/2016 | Sriraman et al. |
| 2016/0343625 A1 | 11/2016 | Wu et al. |
| 2016/0370173 A1 | 12/2016 | Paul et al. |
| 2017/0052319 A1 | 2/2017 | Schultheis et al. |
| 2017/0365444 A1 | 12/2017 | Kim et al. |

FOREIGN PATENT DOCUMENTS

| | | |
|---|---|---|
| CN | 106373850 A | 2/2017 |
| CN | 106415123 A | 2/2017 |
| CN | 106601580 A | 4/2017 |
| CN | 106653658 A | 5/2017 |
| KR | 20140090219 | 7/2014 |
| KR | 20140094848 | 7/2014 |
| KR | 20150094537 | 8/2015 |
| TW | 200739713 | 10/2007 |
| WO | WO 2015169685 | 11/2015 |

* cited by examiner

INTEGRATED CIRCUIT FABRICATION SYSTEM WITH ADJUSTABLE GAS INJECTOR AND METHOD UTILIZING THE SAME

PRIORITY DATA

This application is a Divisional patent application of a U.S. patent application Ser. No. 15/864,807 filed Jan. 8, 2018, which claims priority to U.S. Provisional Patent Application Ser. No. 62/565,325 filed Sep. 29, 2017, the entire disclosures of which are hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing equipment are needed. In one example, a plasma processing system is utilized to perform plasma etching process. During a plasma etching process, the plasma generates volatile etch products from the chemical reactions between the elements of the material etched and the reactive species generated by the plasma, which modifies the surface of the target. The plasma processing system includes a processing chamber maintained at vacuum state and a chemical supply module to provide chemical to chemical for etching. However, the chemical supply module in the existing IC fabrication system experience leaking issue, which further degrades the etching performance. Accordingly, it would be desirable to provide a IC fabrication system and a method utilizing the same absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
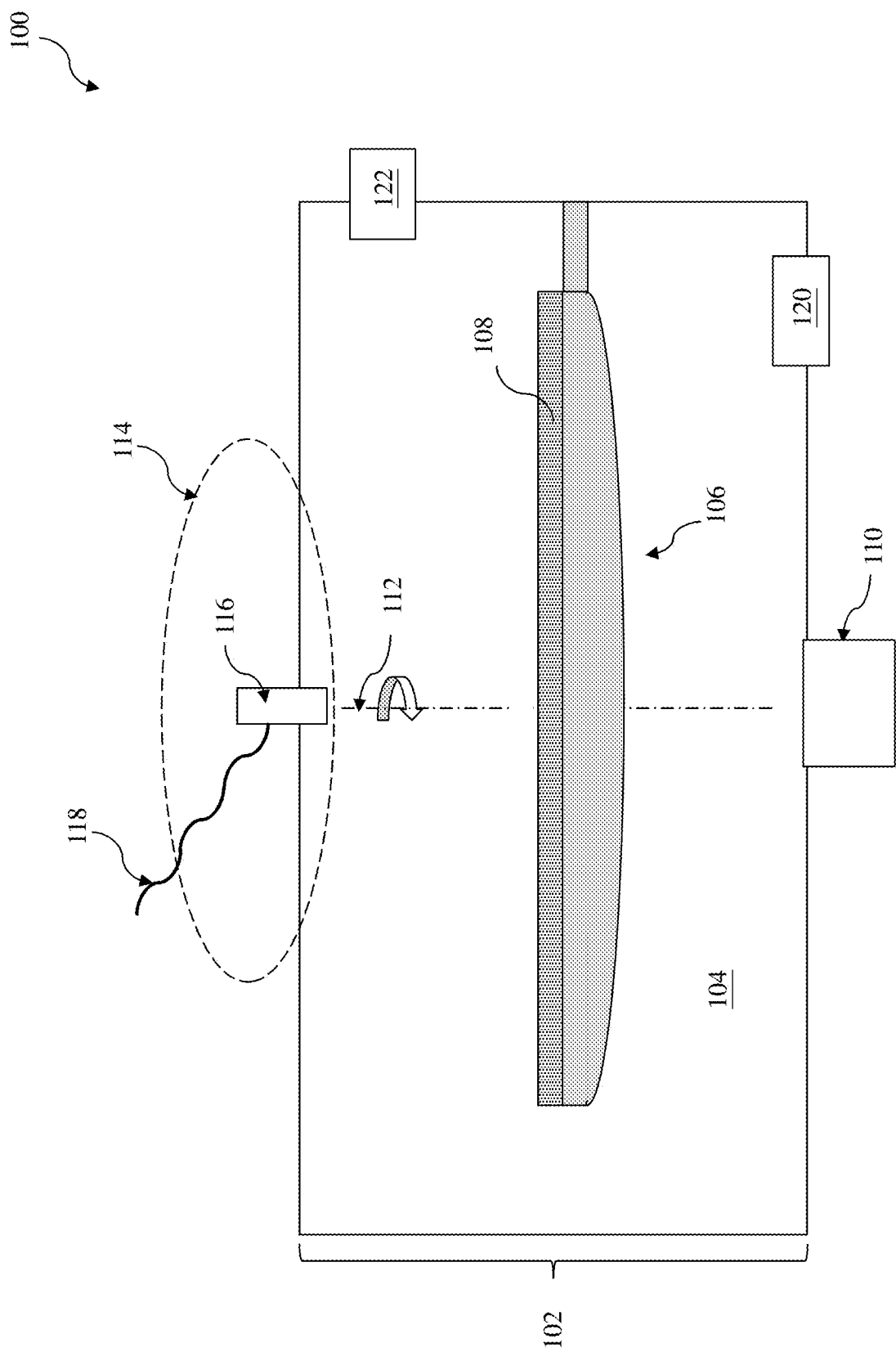
FIG. 1 illustrates a schematic view of a plasma module for integrated circuit fabrication, constructed in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 illustrates a schematic view of a plasma module 100 for integrated circuit (IC) fabrication, constructed in accordance with some embodiments. With reference to FIG. 1 and other figures, the plasma module 100 and the method utilizing the same are collectively described below.

The plasma module 100 includes a processing chamber 102 with enclosed space 104 for semiconductor processing. In the present embodiment, the semiconductor processing is plasma etching, such as plasma etching to metal or polysilicon. The processing chamber 102 includes various walls integrated together such that the enclosed space 104 is isolated from the environment and can be maintained at a suitable state, such as vacuum or a low pressure.

The plasma module 100 also includes a substrate stage 106 provided in the processing chamber 102 to secure a semiconductor substrate 108, such as a silicon wafer. The substrate stage 106 is designed with a rotation mechanism 110, such as a motor. The substrate stage 106 is operable to rotate by the rotation mechanism 110 around a rotation axis 112 so that the semiconductor substrate 108 secured on the substrate stage 106 rotates as well during an IC fabrication.

The plasma module 100 includes one or more chemical delivery unit 114 integrated to the processing chamber 102 and is designed to provide a chemical to the processing chamber 102. In various examples, the chemical is an etching gas or a carry gas, such as nitrogen, argon or other suitable gas. The chemical delivery unit 114 includes an adjustable gas injector 116 attached to the processing chamber and designed to inject the chemical into the processing chamber 102. The chemical delivery unit 114 is further connected to a chemical supply source 118 to provide the chemical to the gas injector 116. The chemical delivery unit 114 is further described in details later.

The plasma module 100 may further includes components, modules and parts integrated together to be functional for IC fabrication, such as plasma etching. For example, the plasma module 100 includes a pumping module 120 integrated with the processing chamber 102 and being operable to maintain the space 104 inside the processing chamber 102 at vacuum state or a low pressure. In various examples, the pumping module 120 may include one or more pumps, and may utilize multiple pumping technologies, such as positive displacement pump, momentum transfer pump, regenerative pump or entrapment pump. Various pumps may be configured in series according to respective working ranges.

The plasma module 100 includes a plasma generation module 122 to generate plasma inside the space 104 in the processing chamber 102. The plasma generation module 122 introduces energy power into the processing chamber to ignite plasma with any suitable technology, such as capacitive-coupled plasma or inductive-coupled plasma.

Figure 2:
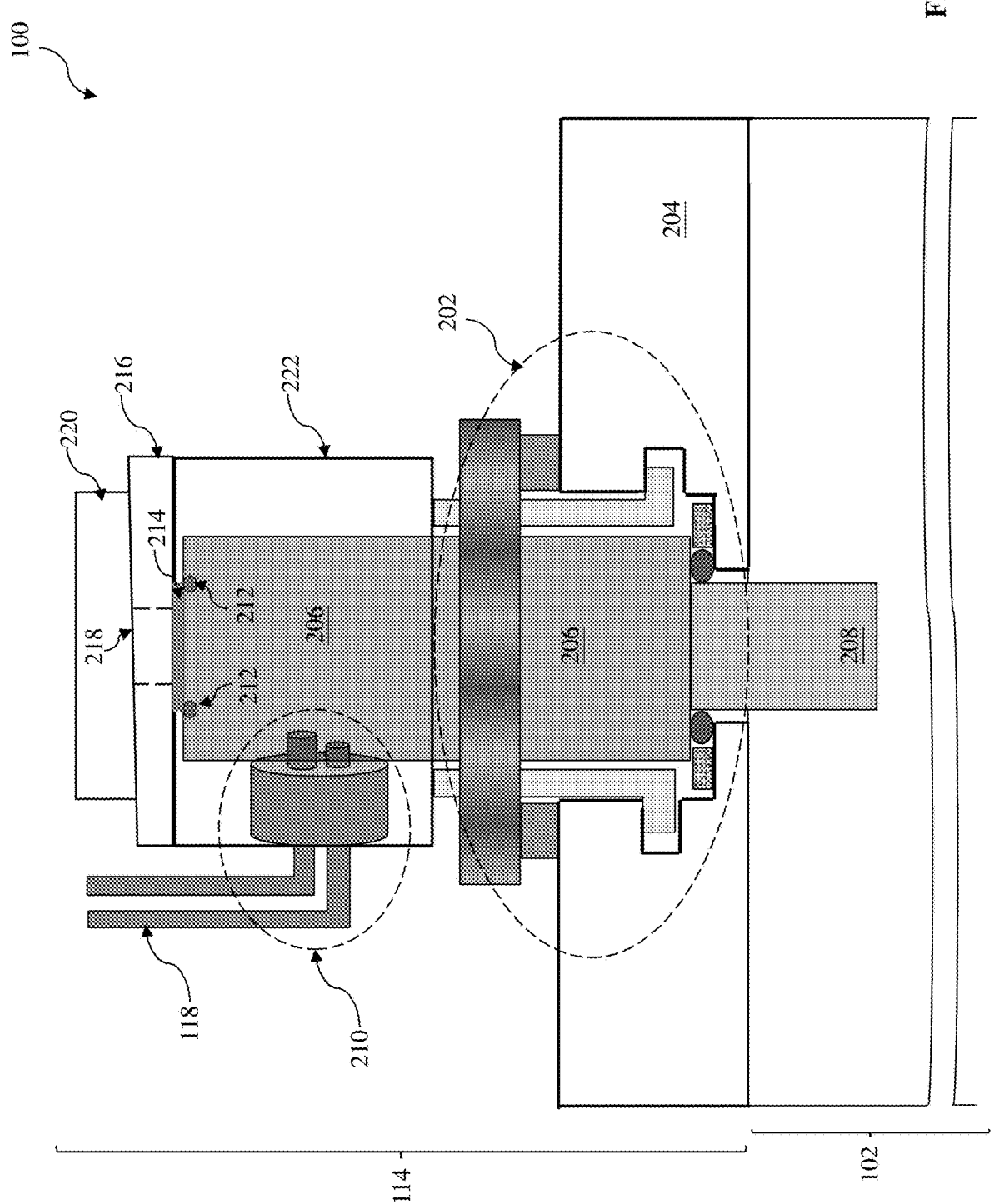
FIG. 2 illustrates a schematic view of the plasma module having a gas injector with an adjustable fastening mechanism, constructed in accordance with some embodiments.

FIG. 2 illustrates a schematic view of the plasma module 100, in portion, constructed in accordance with some embodiments. The chemical delivery unit 114 is illustrated with more details. Particularly, the chemical delivery unit 114 includes an adjustable fastening mechanism. The chemical delivery unit 114 includes a fixture 202 to attach and secure the gas injector 116 onto the top cover 204 of the processing chamber 102. The gas injector 116 includes a cylindrical body 206 to provide a passage for the chemical to a gas injector head 208 configured on one end of the cylindrical body 206. The chemical is delivered to the gas injector 116 from the chemical supply source 118 through an inlet 210 that connects the chemical supply source 118 to the gas injector 116.

The gas injector 116 further includes an O-ring 212 disposed on the gas injector 116, such as on a circular groove of the gas injector 116; a transparent window 214 configured on the O-ring 212; and a gas injector cover 216 configured on the transparent window 214. When the above three components are held together, they provide a sealing effect such that leakage is eliminated. Furthermore, the transparent window 214 provides an additional function, such as monitoring the IC fabrication inside the processing chamber, or particularly monitoring the plasma signal in the plasma module 100. The transparent window 214 is made of a material transparent to detection signal or visual light. In the present embodiment, the transparent window 214 is made of liquid silicone rubber (LSR). The transparent window 214 is designed with a suitable shape, such as a round plate.

The gas injector cover 216 is designed to cover the cylindrical body 206 and may be made of a suitable material with enough mechanical strength and meeting other requirements. For examples, the gas injector cover 216 is made of polytetrafluoroethylene (PTFE). In the present embodiment, the top surface of the gas injector cover 216 is an inclined plane 218 by design.

The chemical delivery unit 114 further includes an adjustable fastening device (AFD) 220 to hold the gas injector cover 216, the transparent window 214 and the O-ring 212 together with adjustable height for enhanced sealing effect. In some embodiments, the gas injector 116 includes an extension portion 222. The adjustable fastening device 220 hold the gas injector cover 216, the transparent window 214, the O-ring 212, and the gas injector together through the extension portion 222.

Figure 3:
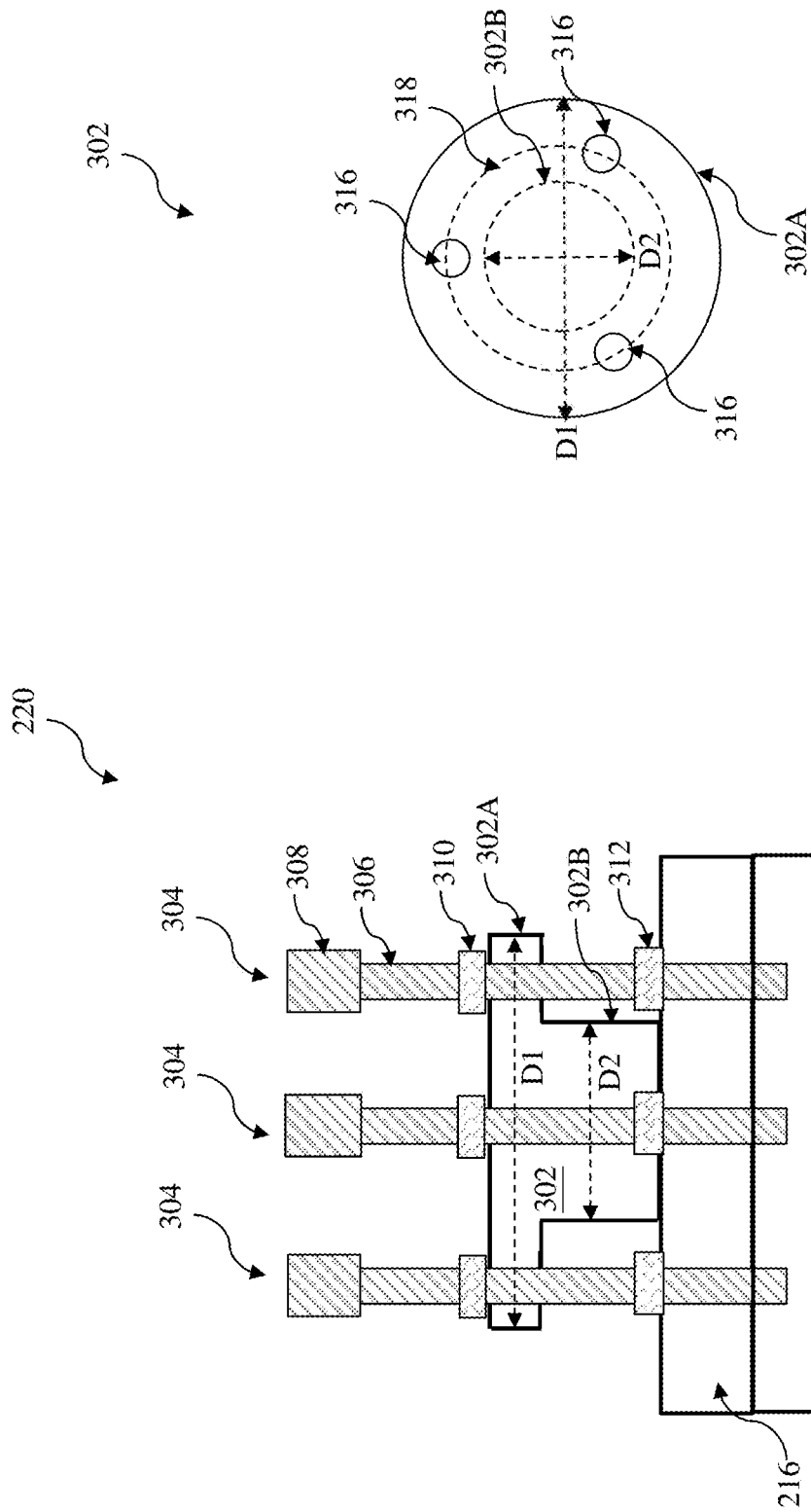
FIG. 3A illustrates a schematic view of the adjustable fastening device, constructed in accordance with some embodiments.
FIG. 3B illustrates a top view of the adjustable fastening device in portion, constructed in accordance with some embodiments.

FIG. 3A illustrates a schematic view of the adjustable fastening device 220, constructed in accordance with some embodiments. The adjustable fastening device 220 is further described in details. The AFD 220 includes a base plate 302 disposed on the gas injector cover 216. The base plate 302 is designed to have suitable geometry to enable the fastening effect between the gas injector cover 216 and the base plate 302 and to have a suitable material, such as PTFE, for the mechanical strength and other functions. With AFD 220, the gas injector 116 is adjustable for height, distance, fastening force and sealing effect.

In the present embodiment, the base plate 302 includes a top portion 302A and a bottom portion 302B having different sizes. As illustrated in FIG. 3A, the top portion 302A spans a dimension D1 and the bottom portion 302B spans a dimension D2 less than D1.

The AFD 220 includes multiple sets of bolt and nuts, each set being referred to as a fastener 304. In the present embodiment, the number of the fasteners is three. Each fastener 304 includes a bolt 306 with a bolt head 308 designed to a structure, such as groove or socket, to provide a means for driving or holding the bolt. Each fastener 304 further includes a first nut 310 and a second nut 312 sleeved on the corresponding bolt 306. Each bolt has a thread pattern on the inside surface and each nut has an opening with thread pattern on inside surface. The nuts and bolt are configured for fastening by thread friction. The first nut 310 is configured above the base plate (particularly, between the bolt head 308 and the base plate 302); and the second nut 312 is configured between the base plate 302 and the gas injector cover 216. The first nut 310 is operable to control the height of the gas injector cover 216 or control the distance between the base plate 302 and the gas injector cover 216; and the second nut 312 is operable to fasten the gas injector cover 216 to the gas injector 220, such as the extended portion 222 of the gas injector 116 configured between the base plate 302 and the gas injector cover 216.

Furthermore, the base plate 302, the gas injector cover 216 and the gas injector 116 (or the extension portion 222 of the gas injector in the present case) each have a plurality of thread holes equidistantly distributed in a way so the plurality of bolts 306 are able to pass through the corresponding thread holes and are tightened to hold those components together. For example, FIG. 3B illustrates a top view of the base plate 302 with three thread holes 316. The three thread holes 316 are equidistantly distributed on the base plate 302, such as on a circle 318. In the present examples, the top portion 302A and the bottom portion 302B have round shapes. The thread holes 316 are formed on the edge region of the top portion 302A outside of the bottom portion 302B.

Thread holes on the gas injector cover 216 and the extension portion 222 are similarly configured. The thread holes match the thread pattern of the blots. When the fasteners 304 are configured as described above, each of the first nuts 310 is tuned to control the height of the gas injector 216, or the distance between the gas injector cover 216 and the extension portion 222 of the gas injector 116 at corresponding location; and the second nut 312 is fastened to hold the gas injector cover 216 and the gas injector 116 together.

In the existing structure, the fasteners are designed without this adjustment mechanism, the uneven fastening forces among different fasteners and the distortion caused thereby cannot be effectively adjusted and eliminated, thus causing the uneven contacts and forces between the transparent window 214 and the O-ring 212. This further leads to leaking issue through the interface between the transparent window 214 and the O-ring 212. In the disclosed AFD 220, each fastener 304 independently and individually can be tuned with corresponding height and distance at the corresponding location to achieve the optimized sealing effect between the O-ring 212 and the transparent window 214, thereby the leakage being eliminated.

Figure 4:
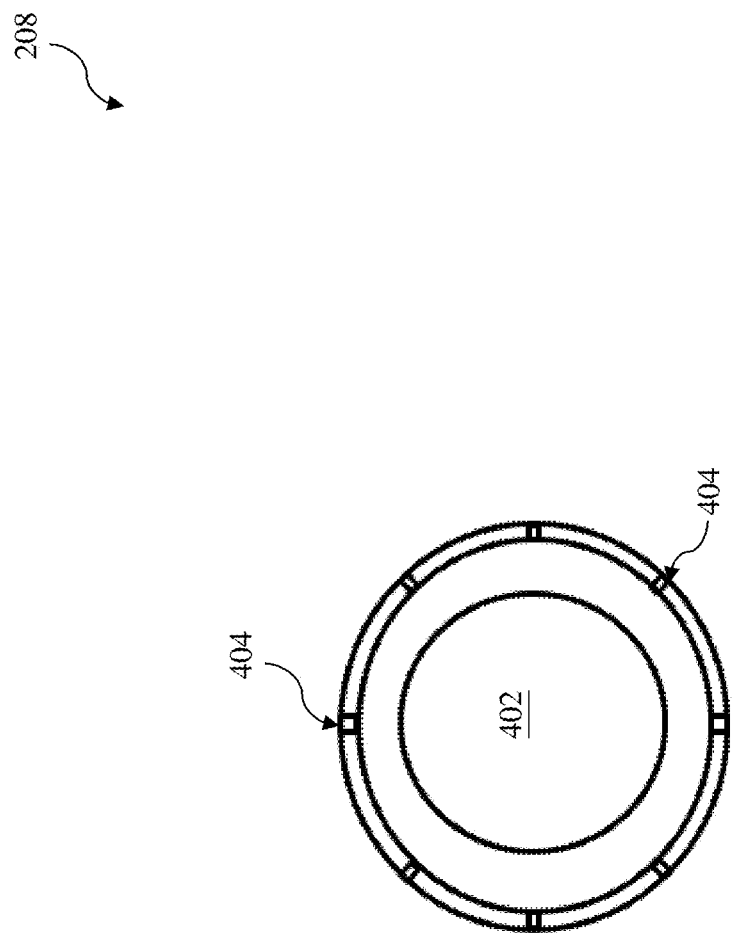
FIG. 4 illustrates a top view of an injector tip of the gas injector, constructed in accordance with some embodiments.

FIG. 4 illustrates a top view of the gas injector head 208 in accordance with some embodiments. The gas injector head 208 includes a plurality of openings for the chemical gas to be injected therethrough. In the present embodiment, the gas injector head 208 includes a central opening 402 and multiple edge openings 404 equidistantly distributed on the edge. For examples, the gas injector head 208 includes eight edge openings 404. The edge openings 404 have a smaller radius than that of the central opening 402.

Figure 5:
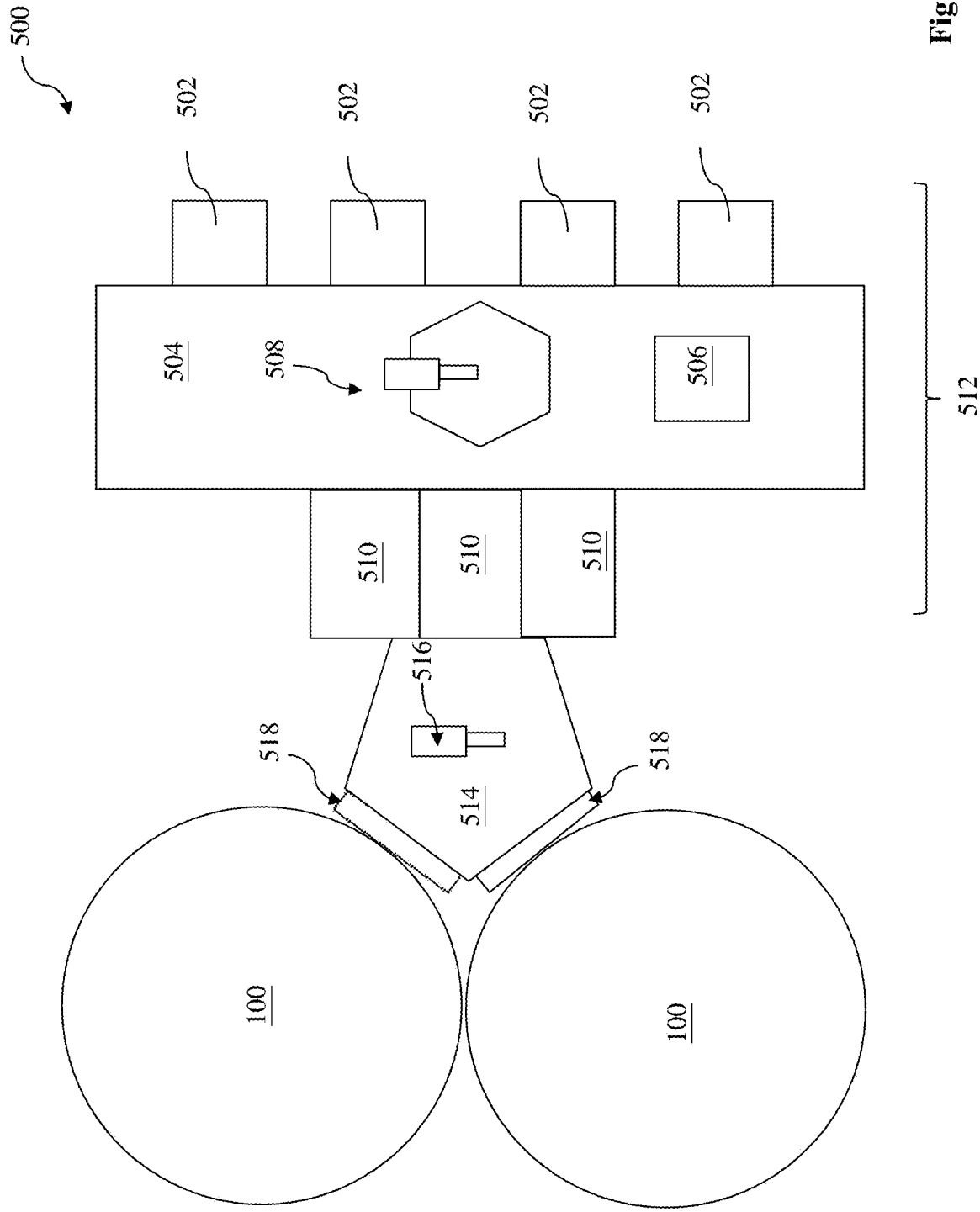
FIG. 5 illustrates a schematic view of an integrated circuit (IC) fabrication system having the plasma module, constructed in accordance with some embodiments.

FIG. 5 is a block diagram of an integrated circuit (IC) fabrication system 500 in accordance with some embodiments. The IC fabrication system 500 includes one or more plasma modules 100 integrated together in a cluster tool. Especially, the plasma module 100 includes one or more chemical delivery unit 114 each having an AFD 220 to fasten the gas injector cover 216 and provide enhanced sealing effect to the interface between the transparent window 214 and the O-ring 212. In an illustrative embodiment, the IC fabrication system 500 includes two plasma modules 100 properly configured and integrated.

The IC fabrication system 500 includes one or more load port 502, through which wafers are loaded and unloaded to the IC fabrication system 500. In the present embodiments, the wafers are loaded and unloaded in batches, by using wafer containers, such as front opening unified pods (FOUPs).

The IC fabrication system 500 may include a loader (or front end unit) 504 for holding, manipulating and transferring wafers. For examples, the loader 504 includes one or more substrate stage 506 for holding and/or orienting one or more wafer. In other examples, the loader 504 includes one or more robot 508 for handling wafers, such as transferring wafers to the plasma modules 100 or to load lock chambers (or load lock units) 510. The robot 508 is configured between the load port 502 and the load lock chambers in a way for proper wafer transferring therebetween. For example, each wafer is transferred by the robot 508 from the load port 502 or from the substrate stage 506 to one of load lock chambers, or is transferred back to the load port 502 by the robot 508. In some embodiments, the IC fabrication system 500 may further include other components, such as one or more load lock chambers 510 configured and designed for various functions, such as pre-orientation and preconditioning. The preconditioning may include degassing, pre-heating or other functions. For examples, multiple load lock chambers 510 may designed and configured for various preconditioning functions, respectively. In some examples, a wafer is oriented, degassed and/or pre-heated in one of the load lock chambers 510 to prepare the wafer for the plasma processing. The IC fabrication system 500 may be configured differently. For example, the load lock chamber 510 in the middle may be used as a path to transfer the wafer(s). In other examples, the IC fabrication system 500 may further include a vacuum module integrated to provide vacuum conditions to respective regions, such as the plasma modules 100. The load ports 502, the loader 504 and the load lock chambers 510 are collectively referred to as a load lock module 512.

The IC fabrication system 500 may further include a transfer module 514 for wafer transfer between the plasma modules 100 and the load lock chambers 510. In some embodiments, the transfer module 514 further includes one or more robot 516 for wafer transferring. The transfer module 514 has openings (doors) 518 connected to the plasma modules 100, respectively.

Figure 6:
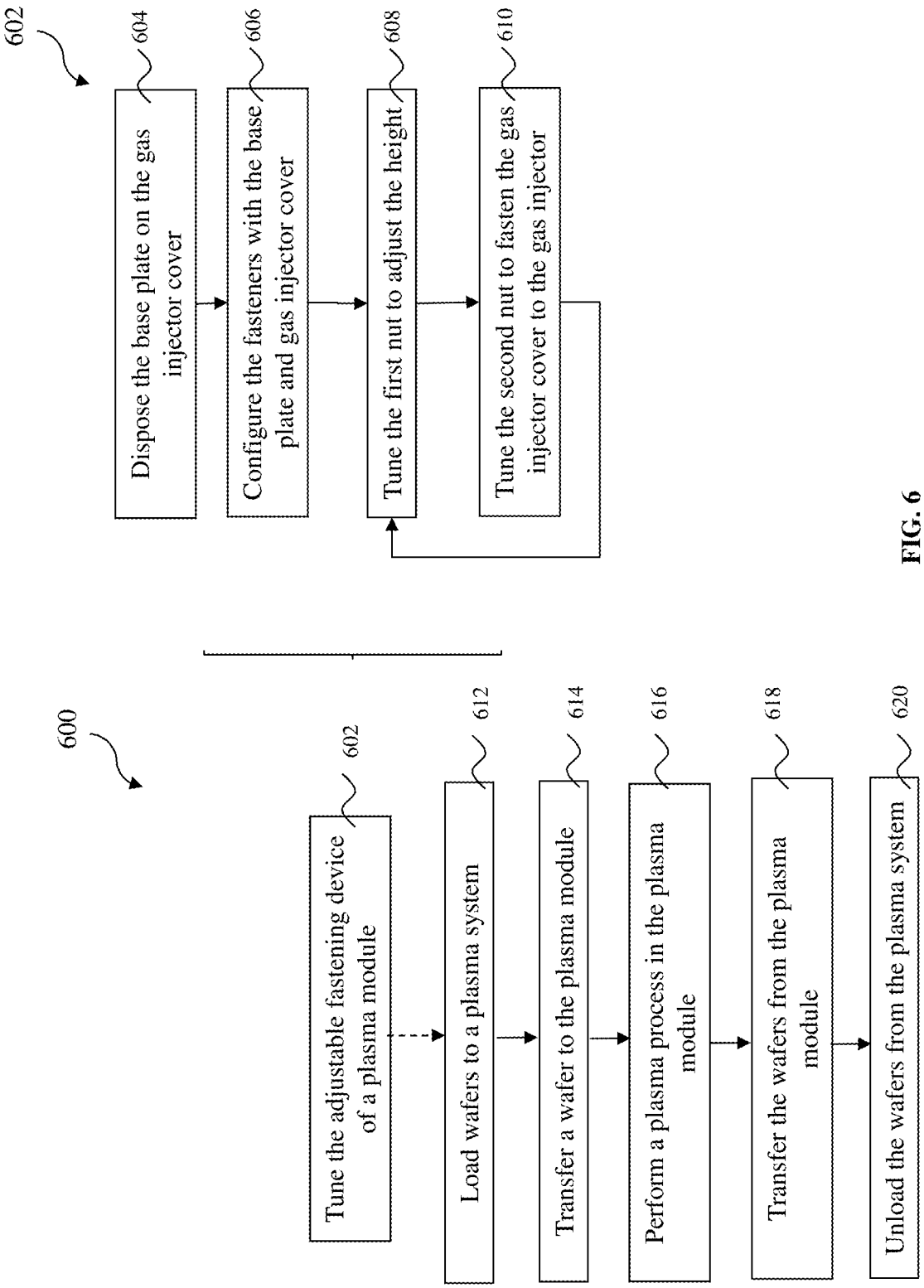
FIG. 6 is a flowchart of a method to utilize the plasma module, in accordance with some embodiments.

FIG. 6 is a flowchart of a method 600 fabricating one or more semiconductor wafers 108 ((particularly, plasma etching a material layer of the semiconductor wafer), in accordance with some embodiments. The method 600 is implemented in the IC fabrication system 500 of FIG. 5. The method 600 is described with reference to FIGS. 5, 6 and other figures.

The method 600 includes an operation 602 to fasten the gas injector 116 with the AFD 220. As noted above, the AFD 220 includes multiple sets of fasteners 304, each further including a bolt 306 and two nuts 310 and 312 sleeved on the corresponding bolt 306. The first nut 310 is configured above the base plate (particularly, between the bolt head 308 and the base plate 302); and the second nut 312 is configured between the base plate 302 and the gas injector cover 216. The operation 602 may include multiple steps. For examples, the operation 602 includes a step 604 to dispose the base plate 302 on the gas injector cover 216 in a proper configuration such that the thread holes of the both parts are aligned.

The operation 602 also includes a step 606 to configure the fasteners 304 with the base plate 302 and the gas injector cover 216. In the present embodiment, the AFD 220 includes three sets of fasteners 304. To each fastener 304, the first nut 310 and the second nut 312 are sleeved on the corresponding bolt 306. Particularly, the first nut 310 is configured above the base plate (particularly, between the bolt head 308 and the base plate 302); and the second nut 312 is configured between the base plate 302 and the gas injector cover 216.

The operation 602 includes a step 608 to adjust the height of the gas injector cover 216 (or control the distance between the base plate 302 and the gas injector cover 216 by tuning the first nut 310; and a step 610 to fasten the gas injector cover 216 to the gas injector 220 by tuning the second nut 312, which adjusts a fastening force between the gas injector cover and the gas injector and further the contact force between the O-ring 212 and the transparent window 214.

The steps 608 and 610 are repeated to other fasteners 304 and may repeat many cycles to all fasteners until the gas injector cover 216 is fastened to the gas injector 116 such that the O-ring 214 and the transparent window 214 are evenly contacted with improved sealing effect, thereby eliminating leaking through the interface between that the O-ring 214 and the transparent window 214.

After the completion of the operation 602 and other initial conditioning, the IC fabrication system 500 is ready for and may proceed to IC fabrication. For example, the method 600 may include an operation 612 to load one or more wafers to the IC fabrication system 500 through the load ports 502. For example, wafers are in one or more batches, such as in FOUPs, are loaded to the IC fabrication system 500 through the load ports 502 in one or more steps, such as loading, degassing, pre-heating, orienting or a subset thereof.

The method 600 includes operation 614 to transfer one or more wafer to one of the plasma module 100 by the robot 516 through the opening 518. For example, the robot 516 sequentially transfers one or more wafer to each of the plasma modules 100. In other examples, the transfer module 514 may include two or more robots 516 to simultaneously transfer wafers to respective plasma modules 100. Specifically, in the present embodiment, one wafer 108 is transferred to the substrate stage 106 of the corresponding plasma module 100 in a configuration that the front surface of the wafer faces upward.

The method 600 proceeds to an operation 616 to perform plasma process to the wafer(s) 108 in one of the plasma modules 100. The operation 616 and following operations are described with one plasma module and one wafer. However, as described above, the multiple wafers may be processed in one of multiple plasma modules 100 and the multiple plasma modules 100 may work in parallel. In the present embodiment, a plasma process is a plasma etching process being applied to the front surface of the wafer 108 during the operation 516. For example, one or more chemical delivered to the processing chamber 102 may be partially converted into plasma to provide etching effect to the semiconductor wafer 108. In some embodiments, the operation 616 may include injecting the chemical to the processing chamber 102 by the gas injector 116; generating plasma to the chemical; and directing the chemical to the semiconductor wafer 108 for etching.

In one example, the front surface of the wafer 108 includes a metal layer, and the plasma etching process is applied to selectively etch the metal. In furtherance of the example, the metal is copper, the etchant (etching gas) may include $CH_4$ and Ar; $CH_4$ and $N_2$; $H_2$ and Ar; or $H_2$ and $N_2$. Accordingly, each plasma module 100 may include more than one chemical delivery unit 114 to deliver the corresponding gases.

In one example, the front surface of the wafer 108 includes a poly-silicon layer, and the plasma etching process is applied to selectively etch the poly-silicon. In furtherance of the example, the etchant includes HBr, $Cl_2$, $SF_6$, $O_2$, Ar, He, or a combination thereof. Accordingly, each plasma module 100 may include more than one chemical delivery unit 114 to deliver the corresponding gases.

In yet another example, the front surface of the wafer 108 includes a silicon oxide layer, and the plasma etching process is applied to selectively etch the silicon oxide. The etchant may include $CF_4$, $C_3F_8$, $C_4F_8$, $CHF_3$, $CH_2F_2$ or a combination thereof. The plasma process may be, alternatively, plasma-enhanced deposition or plasma treatment.

After the completion of the deposition process to the wafer 108 in the plasma modules 100 by the operation 616, the method 600 proceeds to an operation 618 to transfer the wafer 108 to the load lock chamber(s) 510 by the robot 516. This operation is similar to the operation 614 but it is reversed. For example, the multiple wafers are transferred to the load lock chambers 510 from the plasma modules 100, sequentially or in parallel by multiple robots 516.

The method 600 may further include an operation 620 to unload the wafers from the IC fabrication system 500 through the load port 502. The method 600 may include other operations, before, during or after the operations described above. For example, after the operation 620, the wafers may be transferred to other fabrication tools for following fabrications, such as lithography patterning process.

The IC fabrication system 500 and the method 600 may have other embodiments, or alternatives. For examples, even though the method 600 describes a procedure to perform a plasma etch to a wafer, the IC fabrication system and the method utilizing the same may be used to form various thin films, such as etching a gate dielectric layer, a gate electrode layer, a capping layer, a barrier layer, an etch stop layer, a dielectric layer for interlayer dielectric, or a conductive layer for metal lines.

The present disclosure provides an IC fabrication system and a method utilizing the same. By utilizing the disclosed IC fabrication system, the plasma process, such as plasma etching quality and efficiency are improved. The IC fabrication system includes one or more plasma module 100, each further including one or more chemical delivery unit 114 with an AFD 220. The AFD 220 includes multiple sets of fasteners 304, each further including a bolt 306 and two nuts 310 and 312 sleeved on the corresponding bolt 306. The first nut 310 is configured above the base plate (particularly, between the bolt head 308 and the base plate 302); and the second nut 312 is configured between the base plate 302 and the gas injector cover 216. The first nut 310 is tuned to control the distance and the second nut 312 is tuned to provide fastening force to secure the gas injector cover 216 to the gas injector 116 in a way such that the O-ring 214 and the transparent window 214 are evenly contacted with improved sealing effect, thereby eliminating leaking through the interface between that the O-ring 214 and the transparent window 214.

The embodiments of the present disclosure offer advantages over existing art, though it is understood that other embodiments may offer different advantages, not all advantages are necessarily discussed herein, and that no particular advantage is required for all embodiments. Various advantages may present in some embodiments. By utilizing the disclosed IC fabrication system and the method, the IC fabrication, such as plasma etching, is improved with enhanced sealing and fabrication efficiency. Other advantages may include less manufacturing cost and higher manufacturing throughput.

Thus, the present disclosure provides a semiconductor fabrication apparatus. The semiconductor apparatus includes a processing chamber; a substrate stage provided in the processing chamber and being configured to secure and rotate a semiconductor wafer; a gas injector configured to inject a chemical to the processing chamber; a window attached to the gas injector; and an adjustable fastening device coupled with the gas injector and the window.

The present disclosure provides a semiconductor fabrication apparatus. The semiconductor apparatus includes a processing chamber; a substrate stage configured in the processing chamber and being operable to secure and rotate a semiconductor wafer; a gas injector attached to the processing chamber and designed to inject a chemical to the processing chamber; an O-ring configured to the gas injector; a window attached to the gas injector and in direct contacting with the O-ring; a gas injector cover disposed on the window; and an adjustable fastening device integrated with the gas injector and designed to secure the window and the gas injector cover to the gas injector with an adjustable height.

The present disclosure provides a method for semiconductor fabrication. The method includes providing a semiconductor apparatus. The semiconductor apparatus further includes a processing chamber; a substrate stage configured in the processing chamber and being operable to secure and rotate a semiconductor wafer; a gas injector attached to the processing chamber and designed to inject a chemical to the processing chamber; an O-ring configured to the gas injector; a window attached to the gas injector and in direct contacting with the O-ring; a gas injector cover disposed on the window; and an adjustable fastening device integrated with the gas injector and designed to secure the window and the gas injector cover to the gas injector with an adjustable height. The adjustable fastening device includes a base plate configured on the gas injector cover; and a plurality of fasteners to fasten the gas injector cover to the gas injector, wherein each of the fasteners includes a bolt, a first nut and a second nut both sleeved on the bolt, wherein the first nut is configured above the base plate and the second nut is configured between the base plate and the gas injector cover. The method further includes performing an etching process to the semiconductor wafer by the semiconductor apparatus.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for semiconductor fabrication, comprising:
   providing a semiconductor apparatus that includes
   a processing chamber;
   a substrate stage configured in the processing chamber and being operable to secure and rotate a semiconductor wafer;
   a gas injector attached to the processing chamber and designed to inject a chemical to the processing chamber;
   a window attached to the gas injector;
   a gas injector cover configured on the window;
   an O-ring interposed between the gas injector and the window, wherein the O-ring directly contacts the gas injector and the window; and
   an adjustable fastening device integrated with the gas injector and designed to secure the window and the gas injector cover to the gas injector with an adjustable height, wherein the adjustable fastening device includes a base plate configured on the gas injector cover; and a plurality of fasteners to fasten the gas injector cover to the gas injector, wherein each of the fasteners includes a bolt, a first nut and a second nut both sleeved on the bolt, wherein the first nut is configured above the base plate and the second nut is configured between the base plate and the gas injector cover; and
   adjusting the adjustable fastening device to secure the window to the gas injector with an adjustable height, wherein the adjusting the adjustable fastening device includes adjusting the first nut of one of the fasteners to adjust a distance between the gas injector and the gas injector cover and adjusting the second nut of the one of the fasteners to hold together the gas injector and the gas injector cover.

2. The method of claim 1, wherein the adjusting of the adjustable fastening device to secure the window to the gas injector further includes repeating steps of the adjusting of the first nut to adjust a distance between the gas injector and the gas injector cover, and the adjusting of the second nut to hold together the gas injector and the gas injector cover to other of the fasteners until the gas injector cover is fastened to the gas injector such that the O-ring and the window are evenly contacted with improved sealing effect, thereby eliminating leaking through an interface between that the O-ring and the window.

3. The method of claim 2, wherein the adjusting of the adjustable fastening device to secure the window to the gas injector further includes disposing the base plate on the gas injector cover.

4. The method of claim 3, wherein the adjusting of the adjustable fastening device to secure the window to the gas injector further includes configuring the fasteners with the base plate and the gas injector cover by sleeving the first nut and the second nut on the corresponding bolt such that the first nut is configured on one side of the base plate and the second nut is configured on an opposite side of the base plate.

5. The method of claim 4, wherein the first nut is configured between a bolt head of the bolt and the base plate and the second nut is configured between the base plate and the gas injector cover.

6. The method of claim 1, further comprising performing an etching process to the semiconductor wafer by the semiconductor apparatus.

7. The method of claim 6, wherein the performing of the etching process further includes
   injecting the chemical to the processing chamber by the gas injector;
   generating plasma to the chemical; and
   directing the chemical to the semiconductor wafer for etching.

8. A method for semiconductor fabrication, comprising:
   providing a semiconductor apparatus that includes
   a processing chamber;
   a substrate stage configured in the processing chamber and being operable to secure and rotate a semiconductor wafer;
   a gas injector attached to the processing chamber and designed to inject a chemical to the processing chamber;
   a window attached to the gas injector;
   a gas injector cover configured on the window;
   an O-ring interposed between the gas injector and the window, wherein
   the O-ring directly contacts the gas injector and the window; and
   an adjustable fastening device integrated with the gas injector and designed to secure the window and the gas injector cover to the gas injector with an adjustable height, wherein the adjustable fastening device includes a base plate; and
   adjusting the adjustable fastening device to secure the window to the gas injector with an adjustable height, wherein the adjusting of the adjustable fastening device to secure the window to the gas injector includes disposing the base plate on the gas injector cover.

9. The method of claim 8, further comprising
   disposing the O-ring on a circular groove of the gas injector; and
   capping the O-ring by the window.

10. The method of claim 8, wherein
    the adjustable fastening device further includes a plurality of fasteners to fasten the gas injector cover to the gas injector; and
    each of the fasteners includes a bolt, a first nut and a second nut.

11. The method of claim 10, wherein the adjusting of the adjustable fastening device to secure the window to the gas injector further includes
    sleeving the first nut on the bolt such that the first nut is on an upper side of the base plate; and
    sleeving the second nut on the bolt such that the second nut is on a lower side of the base plate.

12. The method of claim 11, wherein the adjusting of the adjustable fastening device to secure the window to the gas injector further includes
    adjusting the first nut to adjust a distance between the gas injector and the gas injector cover; and
    adjusting the second nut to hold together the gas injector and the gas injector cover.

13. The method of claim 12, wherein the adjusting of the adjustable fastening device to secure the window to the gas injector further includes repeating steps of the adjusting of the first nut to adjust a distance between the gas injector and the gas injector cover, and the adjusting of the second nut to hold together the gas injector and the gas injector cover to other of the fasteners until the gas injector cover is fastened to the gas injector such that the O-ring and the window are evenly contacted with improved sealing effect.

14. The method of claim 8, further comprising performing an etching process to the semiconductor wafer by the semiconductor apparatus, wherein the performing of the etching process includes
   injecting the chemical to the processing chamber by the gas injector;
   generating plasma to the chemical; and
   directing the chemical to the semiconductor wafer for etching.

15. A method for semiconductor fabrication, comprising:
   providing a semiconductor apparatus that includes
      a processing chamber;
      a substrate stage configured in the processing chamber and being operable to secure and rotate a semiconductor wafer;
      a gas injector attached to the processing chamber and designed to inject a chemical to the processing chamber;
      a window attached to the gas injector;
      a gas injector cover configured on the window;
      an O-ring that is interposed between the gas injector and the window and directly contacts the gas injector and the window; and
      an adjustable fastening device integrated with the gas injector and designed to secure the window and the gas injector cover to the gas injector with an adjustable height, wherein the adjustable fastening device includes a base plate configured on the gas injector cover; and a plurality of fasteners to fasten the gas injector cover to the gas injector, wherein each of the fasteners includes a bolt, a first nut and a second nut both sleeved on the bolt, wherein the first nut is configured on one side of the base plate and the second nut is configured on an opposite side of the base plate; and
   adjusting the first nut to adjust a distance between the gas injector and the gas injector cover; and
   adjusting the second nut to hold together the gas injector and the gas injector cover, thereby securing the window to the gas injector with an adjustable height.

16. The method of claim 15, wherein the adjusting of the adjustable fastening device to secure the window to the gas injector further includes adjusting other of the fasteners until the gas injector cover is fastened to the gas injector such that the O-ring and the window are evenly contacted with improved sealing effect.

17. The method of claim 15, wherein the first nut is configured between a bolt head of the bolt and the base plate and the second nut is configured between the base plate and the gas injector cover.

18. The method of claim 15, further comprising performing an etching process to the semiconductor wafer by the semiconductor apparatus, wherein the performing of the etching process further includes
   injecting the chemical to the processing chamber by the gas injector;
   generating plasma to the chemical; and
   directing the chemical to the semiconductor wafer for etching.

19. The method of claim 1, wherein the plurality of fasteners are equidistantly distributed on the base plate.

20. The method of claim 8, wherein the gas injector cover includes an inclined top surface, and the adjustable fastening device is disposed on the inclined top surface.

* * * * *